US011335659B2

(12) United States Patent
Topacio et al.

(10) Patent No.: US 11,335,659 B2
(45) Date of Patent: May 17, 2022

(54) SEMICONDUCTOR CHIP WITH PATTERNED UNDERBUMP METALLIZATION AND POLYMER FILM

(71) Applicant: ATI TECHNOLOGIES ULC, Markham (CA)

(72) Inventors: Roden R. Topacio, Markham (CA); Suming Hu, Markham (CA); Yip Seng Low, Markham (CA)

(73) Assignee: ATI TECHNOLOGIES ULC, Markham (CA)

( * ) Notice: Subject to any disclaimer, the term of this patent is extended or adjusted under 35 U.S.C. 154(b) by 42 days.

(21) Appl. No.: 15/395,859

(22) Filed: Dec. 30, 2016

(65) Prior Publication Data

US 2017/0110428 A1 Apr. 20, 2017

Related U.S. Application Data

(62) Division of application No. 14/242,008, filed on Apr. 1, 2014, now Pat. No. 9,576,923.

(51) Int. Cl.
*H01L 23/00* (2006.01)
*H05K 3/34* (2006.01)
*H05K 3/46* (2006.01)

(52) U.S. Cl.
CPC .............. *H01L 24/16* (2013.01); *H01L 24/03* (2013.01); *H01L 24/05* (2013.01); *H01L 24/08* (2013.01); *H01L 24/11* (2013.01); *H01L 24/13* (2013.01); *H01L 24/17* (2013.01); *H01L 24/81* (2013.01); *H01L 24/14* (2013.01); *H01L 2224/02166* (2013.01); *H01L 2224/0345* (2013.01); *H01L 2224/0346* (2013.01);
(Continued)

(58) Field of Classification Search
CPC ......... H01L 24/81; H01L 24/17; H01L 24/16; H01L 24/08; H01L 24/14; H01L 2224/085; H01L 2224/16057; H01L 2224/16221; H01L 2224/17104
See application file for complete search history.

(56) References Cited

U.S. PATENT DOCUMENTS 6,028,011 A 2/2000 Takase et al.
6,057,232 A 5/2000 Lee
(Continued)

OTHER PUBLICATIONS

Arthur Keigler et al.; Copper Deposition for Pillars and Vias; Semiconductor Manufacturing Magazine; vol. 7, Issue 8; Aug. 2006; pp. 1-6.
(Continued)

*Primary Examiner* — Mohammad M Choudhry

(57) ABSTRACT

Various semiconductor chip solder bump and underbump metallization (UBM) structures and methods of making the same are disclosed. In one aspect, a method is provided that includes forming a first underbump metallization layer on a semiconductor chip is provided. The first underbump metallization layer has a hub, a first portion extending laterally from the hub, and a spoke connecting the hub to the first portion. A polymer layer is applied to the first underbump metallization layer. The polymer layer includes a first opening in alignment with the hub and a second opening in alignment with the spoke. A portion of the spoke is removed via the second opening to sever the connection between the hub and the first portion.

20 Claims, 12 Drawing Sheets

(52) U.S. Cl.
CPC .......... *H01L 2224/0348* (2013.01); *H01L 2224/03464* (2013.01); *H01L 2224/03831* (2013.01); *H01L 2224/03903* (2013.01); *H01L 2224/0401* (2013.01); *H01L 2224/05012* (2013.01); *H01L 2224/05017* (2013.01); *H01L 2224/05019* (2013.01); *H01L 2224/05027* (2013.01); *H01L 2224/05124* (2013.01); *H01L 2224/05144* (2013.01); *H01L 2224/05147* (2013.01); *H01L 2224/05166* (2013.01); *H01L 2224/05564* (2013.01); *H01L 2224/05639* (2013.01); *H01L 2224/05644* (2013.01); *H01L 2224/05655* (2013.01); *H01L 2224/05672* (2013.01); *H01L 2224/05681* (2013.01); *H01L 2224/085* (2013.01); *H01L 2224/10126* (2013.01); *H01L 2224/1146* (2013.01); *H01L 2224/1148* (2013.01); *H01L 2224/11849* (2013.01); *H01L 2224/131* (2013.01); *H01L 2224/13111* (2013.01); *H01L 2224/14131* (2013.01); *H01L 2224/165* (2013.01); *H01L 2224/16057* (2013.01); *H01L 2224/16104* (2013.01); *H01L 2224/16221* (2013.01); *H01L 2224/16227* (2013.01); *H01L 2224/17104* (2013.01); *H01L 2224/81191* (2013.01); *H01L 2224/81193* (2013.01); *H01L 2224/81815* (2013.01); *H01L 2924/12042* (2013.01); *H05K 3/3436* (2013.01); *H05K 3/4629* (2013.01); *H05K 3/4644* (2013.01); *H05K 3/4682* (2013.01); *H05K 2201/10674* (2013.01)

(56) References Cited

U.S. PATENT DOCUMENTS

| | | | |
|---|---|---|---|
| 6,111,317 A | 8/2000 | Okada et al. | |
| 6,362,087 B1 | 3/2002 | Wang et al. | |
| 20,056,901 | 5/2002 | Ono et al. | |
| 6,455,408 B1 | 9/2002 | Hwang et al. | |
| 6,479,900 B1 | 11/2002 | Shinogi et al. | |
| 6,548,898 B2 | 4/2003 | Matsuki et al. | |
| 30,151,141 | 8/2003 | Matsuki et al. | |
| 6,656,828 B1 | 12/2003 | Maitani et al. | |
| 30,222,352 | 12/2003 | Kung et al. | |
| 6,674,162 B2 | 1/2004 | Takao | |
| 6,784,543 B2 | 8/2004 | Matsuki et al. | |
| 6,794,732 B2 | 9/2004 | Nakatani | |
| 6,974,732 B2 | 12/2005 | Ohtani et al. | |
| 7,078,796 B2 | 7/2006 | Dunn et al. | |
| 7,227,262 B2 | 6/2007 | Tanida | |
| 7,800,240 B2 | 9/2010 | Yu | |
| 8,063,495 B2 | 11/2011 | Miyata et al. | |
| 20,261,812 | 10/2012 | Topacio | |
| 8,330,271 B2 | 12/2012 | Kato et al. | |
| 8,432,046 B2 | 4/2013 | Miyata et al. | |
| 9,576,923 B2 * | 2/2017 | Topacio | H01L 24/13 |
| 2002/0185721 A1 * | 12/2002 | Hwang | H01L 23/3114 257/678 |
| 2004/0016948 A1 * | 1/2004 | Lin | H01L 23/522 257/300 |

OTHER PUBLICATIONS

Unimicron Corporation; Product Development; www.unimicron.com/en/tech03.htm; 2007; pp. 1-3.

Unimicron Corporation; *SPOP Category.pdf*; www.unimicron.com; Feb. 16, 2010.

\* cited by examiner

SEMICONDUCTOR CHIP WITH PATTERNED UNDERBUMP METALLIZATION AND POLYMER FILM

This application is a divisional of Ser. No. 14/242,008, filed Apr. 1, 2014.

BACKGROUND OF THE INVENTION

1. Field of the Invention

This invention relates generally to semiconductor processing, and more particularly to semiconductor chip solder bump structures and methods of making the same.

2. Description of the Related Art

Flip-chip mounting schemes have been used for decades to mount semiconductor chips to circuit boards, such as semiconductor chip package substrates. In many conventional flip-chip variants, a plurality of solder joints are established between input/output (I/O) sites of a semiconductor chip and corresponding I/O sites of a circuit board. In one conventional process, a solder bump is metallurgically bonded to a given I/O site or pad of the semiconductor chip and a so-called pre-solder is metallurgically bonded to a corresponding I/O site of the circuit board. Thereafter the solder bump and the pre-solder are brought into proximity and subjected to a heating process that reflows one or both of the solder bump and the pre-solder to establish the requisite solder joint.

In one conventional process, the connection of the solder bump to a particular I/O site of a semiconductor chip entails forming an opening in a top-level dielectric layer of a semiconductor chip proximate the I/O site and thereafter depositing metal to establish an underbump metallization (UBM) structure. The solder bump is then metallurgically bonded to the UBM by reflow. In a conventional process for forming a UBM, a titanium layer is blanket deposited on a passivation structure. Thereafter a copper plating layer is deposited on the titanium layer. A polyimide layer is next patterned on the copper plating layer. The polyimide layer is patterned in a doughnut shape with a central opening. A solder barrier layer is next plated in the opening. The uncovered copper and titanium layers are etched to leave a round metal shape beneath the doughnut polyimide. The doughnut polyimide can subsequently delaminate.

The present invention is directed to overcoming or reducing the effects of one or more of the foregoing disadvantages.

SUMMARY OF EMBODIMENTS OF THE INVENTION

In accordance with one aspect of an embodiment of the present invention, a method of forming a first underbump metallization layer on a semiconductor chip is provided. The first underbump metallization layer has a hub, a first portion extending laterally from the hub, and a spoke connecting the hub to the first portion. A polymer layer is applied to the first underbump metallization layer. The polymer layer includes a first opening in alignment with the hub and a second opening in alignment with the spoke. A portion of the spoke is removed via the second opening to sever the connection between the hub and the first portion.

In accordance with another aspect of an embodiment of the present invention, a method of coupling a semiconductor chip to a circuit board is provided. The semiconductor chip has a first underbump metallization layer. The first underbump metallization layer has a hub, a first portion extending laterally from the hub, and a spoke connecting the hub to the first portion. The semiconductor chip has a polymer layer on the first underbump metallization layer. The polymer layer includes a first opening in alignment with the hub and a second opening in alignment with the spoke. The chip also includes a second underbump metallization layer in the first opening. The method includes removing via the second opening a portion of the spoke to sever the connection between the hub and the first portion, coupling a solder structure to the second underbump metallization layer, and coupling the solder structure to the circuit board.

In accordance with another aspect of an embodiment of the present invention, an apparatus is provided that includes a semiconductor chip and a first underbump metallization layer on a semiconductor chip. The first underbump metallization layer has a hub, a first portion extending laterally from the hub, and a spoke connecting the hub to the first portion. The chip also includes a polymer layer on the first underbump metallization layer. The polymer layer includes a first opening in alignment with the hub and a second opening in alignment with the spoke.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip are described herein. One example includes solder bump connection structures, such as UBMs, fabricated on respective conductor pads. A given UBM layer includes a hub and one or more spokes emanating therefrom to connect to an additional UBM layer. A polymer layer is laid over the UBM layer with an opening to the hub and one or more openings leading to the spoke(s). The spokes are eventually severed by etching through the spoke openings in the polymer layer. This leaves a suitable size UBM hub with a large UBM-to-polymer layer interface, which is resistant to delamination. Additional details will now be described.

Figure 1:
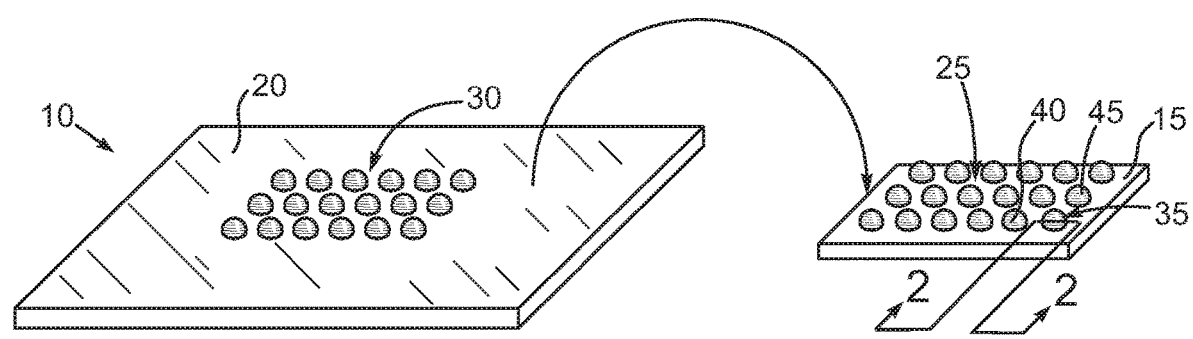
FIG. 1 is a pictorial view of an exemplary embodiment of a semiconductor chip device that includes a semiconductor chip mountable on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a semiconductor chip 15 that may be mounted on a circuit board 20. In this illustrative embodiment, and to illustrate certain features of the semiconductor chip 15, the chip 15 is shown detached and flipped over from its mounting position on the circuit board 20. The semiconductor chip 15 includes multiple solder bumps 25, which are designed to metallurgically bond with the corresponding array of solder structures 30 on the circuit board 20 and form plural solder joints or other type of solder connections when the semiconductor chip 15 is mounted to the circuit board 20. Note that three of the solder bumps 25 are separately labeled 35, 40 and 45. The solder bump 35 will be used to illustrate additional features of the semiconductor chip 15 in conjunction with subsequent figures.

Figure 2:
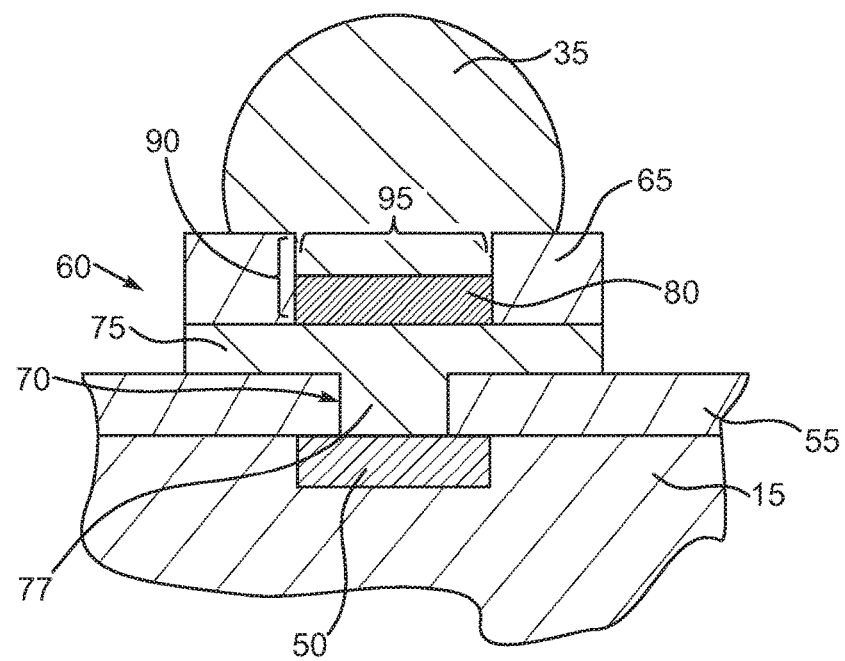
FIG. 2 is a sectional view of FIG. 1 taken at section 2-2.

FIG. 2 is a sectional view of FIG. 1 taken at section 2-2. Before turning to FIG. 2 in earnest, it should be noted that section 2-2 passes through a portion of the semiconductor chip 15 that includes the solder bump 35. The following discussion of the solder bump 35 will be illustrative of the other solder bumps 25 and related structures. Attention is now turned to FIG. 2. For simplicity of illustration, the full depth of the semiconductor chip 15 is not depicted and the features thereof are not drawn to scale. The solder bump 35 is designed to provide an electrical connection between the circuit board 20 and an underlying pad 50. The skilled artisan will appreciate that the pad 50 may be part of a topmost layer of interconnect metallization and may be connected to various other electrical structures both laterally and vertically that form up an interconnect system for the semiconductor chip 15. In addition, the skilled artisan will appreciate that somewhere within the confines of the semiconductor chip 15 an active device region with multitudes of integrated circuit elements such as transistors, resistors and others is positioned.

A variety of intervening structures are positioned between the solder bump 35 and the conductor pad 50. Proceeding from bottom to top, these intervening structures include a passivation structure 55, an underbump metallization (UBM) structure 60 and a polymer layer 65. The passivation structure 55 is designed to protect the conductor pad 50 from physical damage and contamination prior to the manufacture of the UBM and attachment of the solder bump 35. Exemplary materials include silicon dioxide, silicon nitride, polyimide, laminates of these or the like. The passivation structure 55 includes an opening 70 through which a portion of the UBM 60 projects.

The UBM 60 is designed to satisfy a few important objectives, namely, to bond to the overlying solder bump 35 or other solder structure, to establish a conductive interface with an underlying conductor structure, in this case the conductor pad 50, and to bond as necessary with underlying or surrounding dielectrics, such as the passivation structure 55, all while providing a barrier to the diffusion of solder constituents into underlying conductor structures, which might otherwise degrade those conductor structures. In this illustrative embodiment, the UBM 60 may consist of a laminate 75 of a sputtered layer of Ti/W topped with a layer of sputtered copper, and a plated nickel top layer 80. Other metal combinations could be used as well, such as tantalum, gold, silver, vanadium or the like. A portion 77 of the laminate 75 is positioned in the opening 70 of the passivation structure 55.

The polymer layer 65 is positioned on the laminate 75 of the UBM 60 and provided with a suitable opening 90 through which a portion 95 of the solder bump 35 projects and makes metallurgical contact with the UBM top layer 80. The polymer layer 65 for a given bump 35 may be patterned as an island as shown. The footprints of the UBM 60 and the polymer layer 65 are not fully evident from FIG. 2, but will be further illustrated in a subsequent figure. A variety of materials, such as polyimide, benzocyclobutene or the like may be used for the polymer layer 65.

The solder bump 35 and the other solder bumps 25 shown in FIG. 1 may be composed of a variety of lead-based or lead-free solders. An exemplary lead-based solder may have a composition at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. Referring again briefly to FIG. 1, the solder structures 30 of the circuit board 20 may be composed of the same types of materials. Optionally, the solder structures 30 may be eliminated in favor of a single solder structure or a solder plus a conducting post arrangement.

Figure 3:
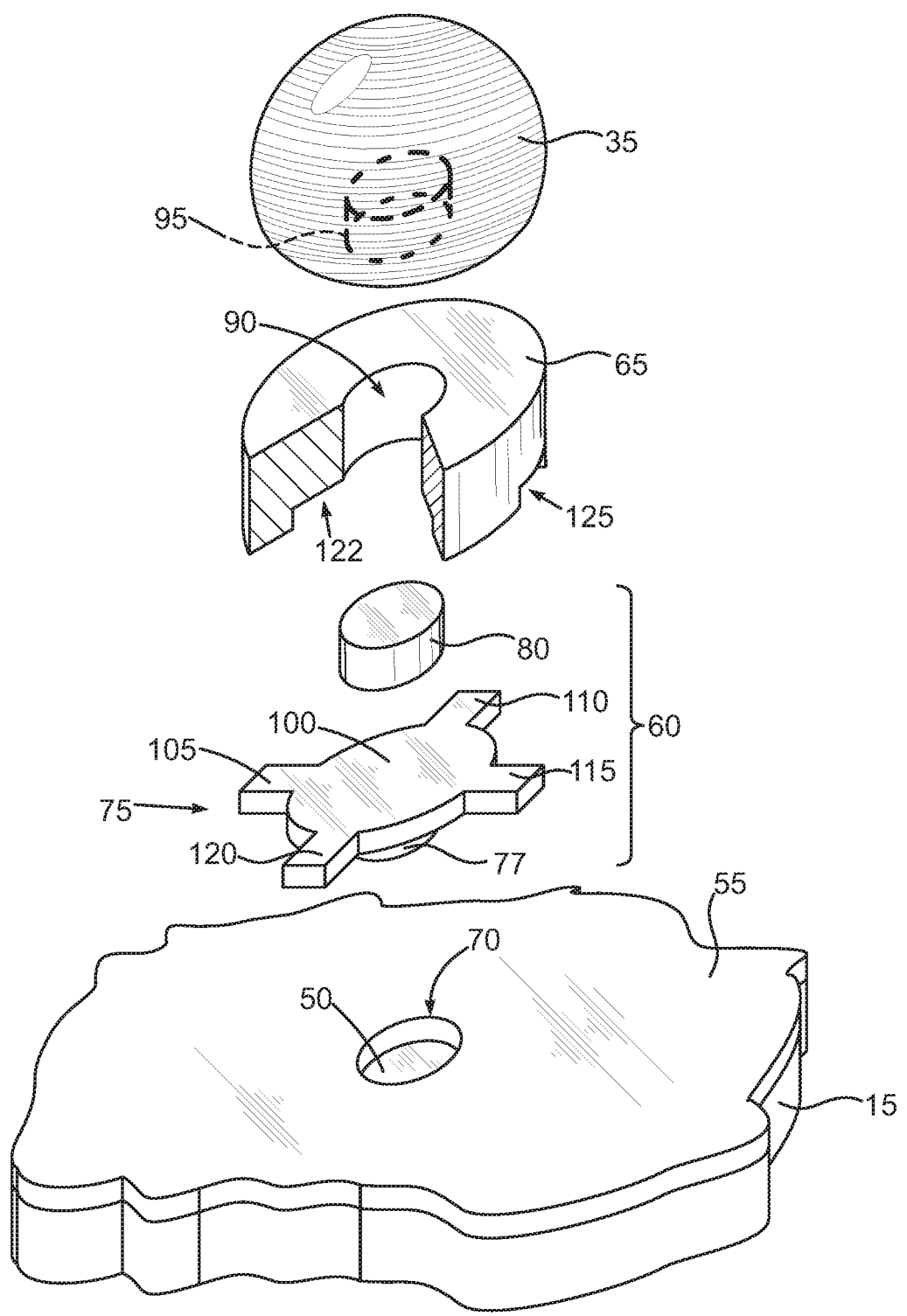
FIG. 3 is a partially exploded pictorially view of a portion of the semiconductor chip of FIGS. 1 and 2.

Additional details of the structure and function of the UBM 60 and other features associated therewith may be understood by referring now to FIG. 3, which is a partially exploded pictorial view of the solder bump 35 and UBM 60 and polymer layer 65 depicted in FIG. 2. Note again that only a portion of the semiconductor chip is illustrated and not necessarily at full depth or to scale. The opening 70 in the passivation structure 55 may be circular as depicted or other shaped as desired. Accordingly, the portion 77 of the UBM laminate 75 may be circular as well depending upon the shape of the opening 70. The UBM laminate 75 is patterned as a central hub 100 and plural spokes 105, 110, 115 and 120 projecting radially therefrom. These spokes play a couple of roles. First, they provide enhanced surfaces to facilitate the adhesion of the overlying polymer layer 65, which is doughnut shaped as shown in FIG. 3. Second, they provide that polymer layer adhesion capability while utilizing proportionately less metal and thus result in a lower parasitic capacitance associated with any overlap with the underlying conductor pad 50 in the chip 15. Since the polymer layer 65 is patterned as a donut structure over the UBM laminate 75, there will be a circumferential cut out 122 that tracks the depth and perimeter of the hub 100 as well as four slots, only one of which is visible in FIG. 3 and numbered 125, which sit over respective of the spokes 105, 110, 115 and 120. The UBM top layer 80 may have a circular footprint that matches the circular footprint of the opening 90 in the polymer layer 65 as shown. Similarly, the solder bump 35 may seat on the polymer layer 65 and with its portion 95 being at least partially positioned in the opening 90 and metallurgically bonded to the UBM top layer 80. Here the spokes 105, 110, 115 and 120 are rectangular in footprint and number four. However, one or more may be used and be of virtually any footprint.

Figure 4:
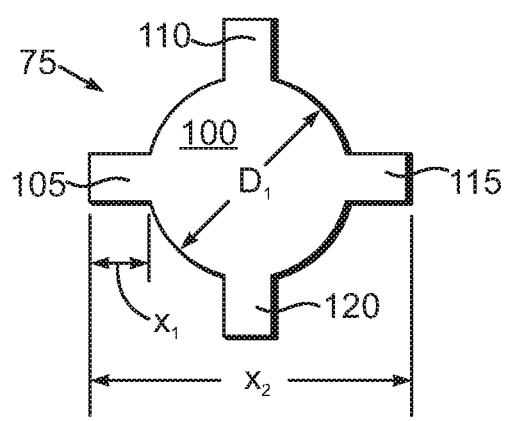
FIG. 4 is a plan view of an exemplary embodiment of a underbump metallization (UBM) structure.
Figure 5:
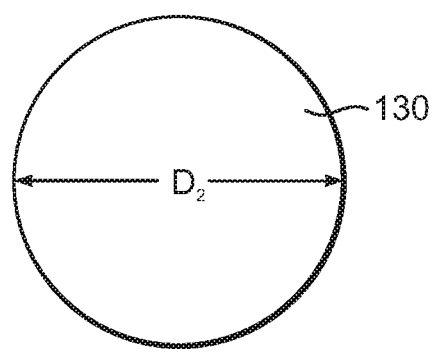
FIG. 5 is a plan view of a conventional underbump metallization (UBM) structure.
Figure 6:
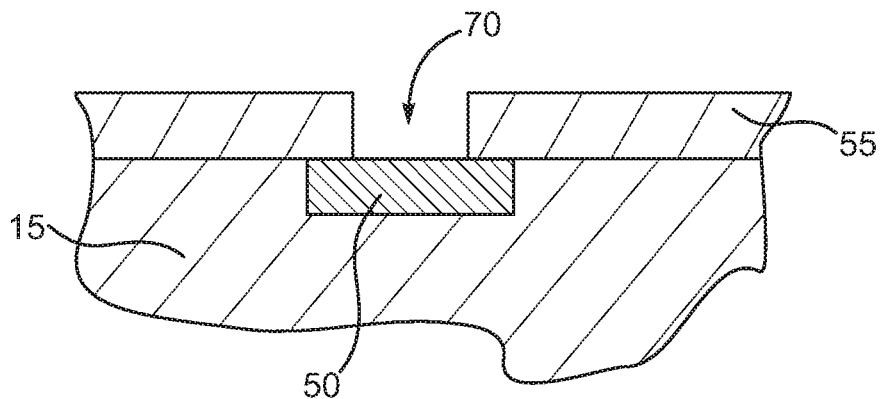
FIG. 6 is a sectional view depicting exemplary passivation layer patterning.
Figure 7:
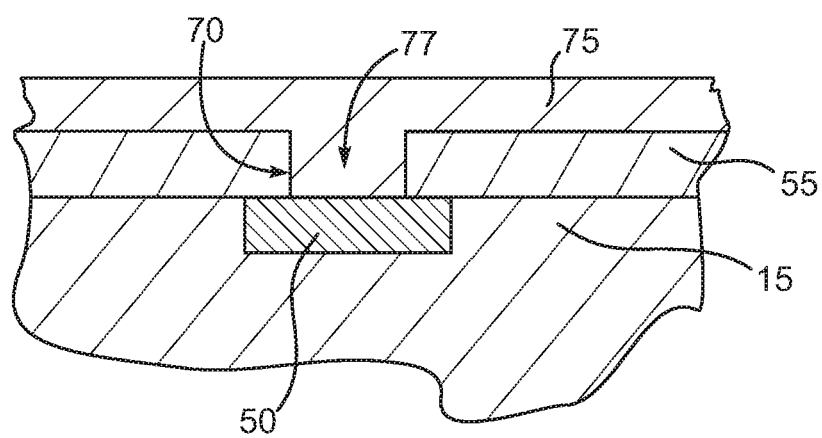
FIG. 7 is a sectional view like FIG. 6, but depicting exemplary UBM laminate layers application.

Additional details of the UBM laminate 75 may be understood by referring now to FIG. 4, which is a plan view of just the UBM laminate 75. As noted above, the laminate 75 may consist of a hub 100 and plural spokes 105, 110, 115 and 120. The hub 100 may be patterned with some diameter $D_1$ and two opposing spokes, say 105 and 115, may be fabricated with lengths $x_1$ such that the total distance $x_2$ from the end of one spoke 105 to the end of the opposite spoke 115 may be $2x_1+D_1$. It may be useful at this point to briefly contrast the construction of the laminate 75 with a conventional UBM laminate structure 130 depicted in plan in FIG. 5. Note that the conventional UBM laminate 130 has some diameter $d_2$. The benefit of using the structure of the laminate 75 depicted in FIG. 4 over the conventional UBM laminate structure 130 depicted in FIG. 5 is that the dimension $x_2$ may be substantially the same as the diameter $D_2$ of the conventional UBM structure 130 but since the hub 100 has a smaller diameter $D_1$ the overlap capacitance is greatly reduced while still maintaining substantial adhesion surface area for the overlying polymer layer 65 depicted in FIG. 3.

An exemplary process flow for fabricating the UBM 60 and the solder bump 35 depicted in FIG. 2 will be described now in conjunction with FIGS. 6-14. The process will focus on UBM 60 and the solder bump 35, but will be illustrative of the other solder bumps 25 and related structures shown in FIG. 1. Attention is initially turned to FIG. 6, which depicts the semiconductor chip 15 following the fabrication of a conductor pad 50 and the passivation structure 55. These steps and the steps that follow may be performed at the wafer level or on a die basis. The conductor pad 50 is electrically connected to another conductor structure (not visible) in the chip 15 that may be part of the plural metallization layers in the semiconductor chip 15. The conductor pad 50 may be used as an input/output site for power, ground or signals or may be used as a dummy pad that is not electrically tied to other structures. The conductor structure 50 may form part of what may be multiple layers of conductor structures and interconnected by vias and surrounded by dielectric material layers (not shown). The conductor pad 50 may be composed of a variety of conductor materials, such as aluminum, copper, silver, gold, titanium, refractory metals, refractory metal compounds, alloys of these or the like. In lieu of a unitary structure, the conductor pad 50 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the conductor pad 50. Various well-known techniques for applying metallic materials may be used, such as physical vapor deposition, chemical vapor deposition, plating or the like. It should be understood that additional conductor structures could be used.

The passivation structure 55 may consist of alternating layers of dielectric materials, such as silicon dioxide and silicon nitride, and may be formed by well-known chemical vapor deposition (CVD) and/or oxidation or oxidation techniques. A suitable lithography mask (not shown) may be formed on the passivation structure 55 and by well-known lithography steps patterned with a suitable opening in alignment with the conductor pad 50. Thereafter, one or more material removal steps may be performed in order to produce the opening 70 in the passivation structure 55 so that the conductor pad 50 is exposed. For example, the material removal steps may include one or more dry and/or wet etching processes suitable for the particular materials selected for the passivation structure 55. Following the material removal to yield the opening 70, the mask (not shown) may be stripped by ashing, solvent stripping or the like.

The fabrication of the UBM 60 will now be described. The skilled artisan will appreciate that a UBM is designed to bond to an overlying solder bump or other solder structure, to establish a conductive interface with an underlying conductor structure, in this case the conductor pad 50, to bond as necessary with underlying or surrounding dielectrics, all while providing a barrier to the diffusion of solder constituents into underlying conductor structures, which might otherwise degrade those conductor structures. UBMs may use multiple layers of different compositions depending on the type of solder application process. In this illustrative embodiment suitable for a plated solder bump, the UBM 60 may be formed as a series of layers applied in succession. The semiconductor chip 15 may be subjected to a blanket sputter deposition process to apply the UBM laminate 75. In an exemplary embodiment, this sputter process involves sputter deposition of Ti/W, although aluminum or titanium could also be used. Next, a plating layer, such as of copper or gold, is deposited by electroless plating or sputter deposition. The UBM laminate 75 blanket coats the passivation structure 55 while the portion 77 of the laminate 75 fills the opening 70 in the passivation 55 and bonds to the pad 50.

Figure 8:
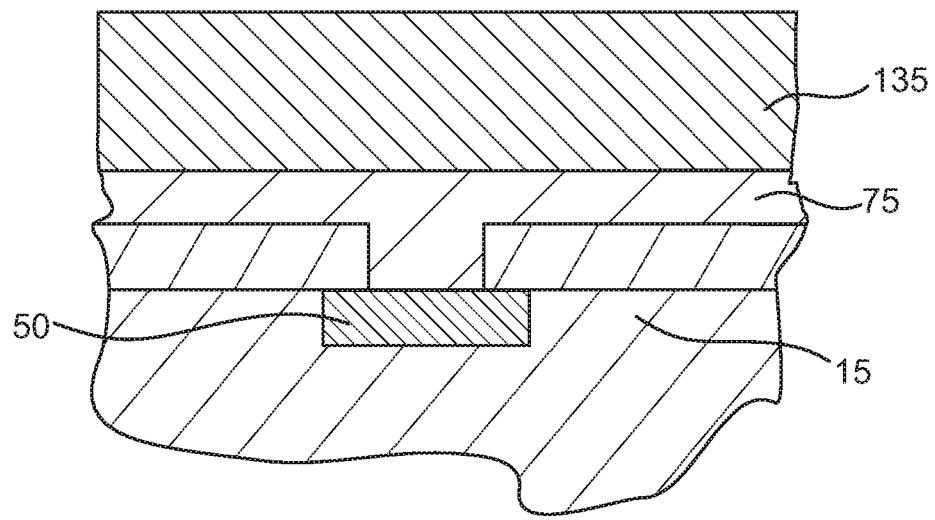
FIG. 8 is a sectional view like FIG. 7, but depicting exemplary masking of the UBM laminate layers.
Figure 9:
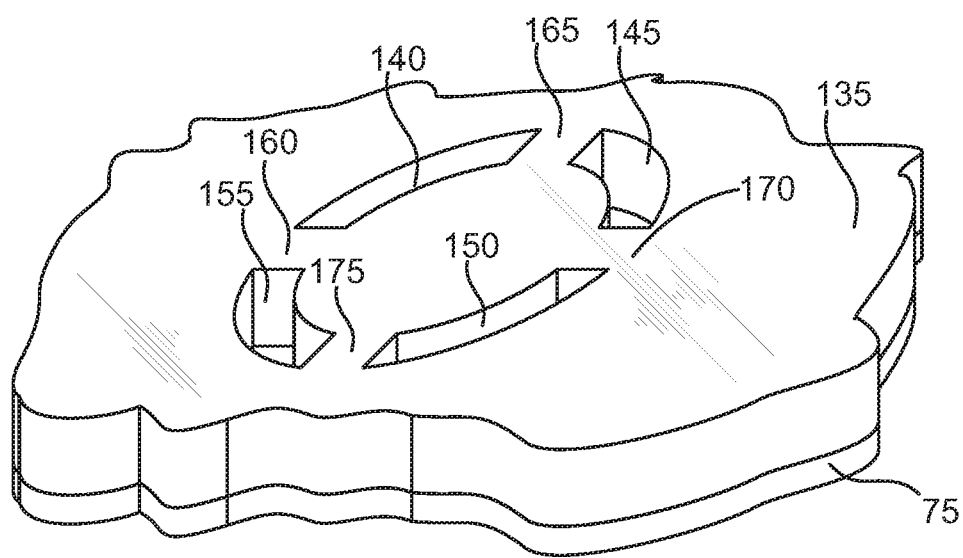
FIG. 9 is a pictorial view depicting exemplary masking of the UBM laminate layers.
Figure 10:
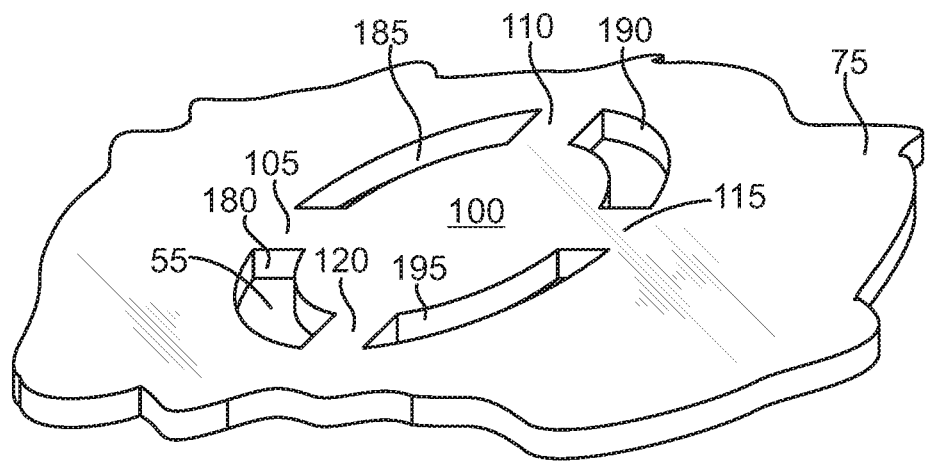
FIG. 10 a pictorial view depicting exemplary material removal from the UBM laminate layers to pattern a hub and spokes.

As shown in FIG. 8, a mask 135 is formed on the UBM laminate 75 and particularly at the location slated for eventual solder bump attachment and thus in alignment with the conductor pad 50. The mask 135 may be formed from positive tone resist, a hard mask or a non-contact mask. Patterning may be by well-known photolithography. The mask 135 is patterned with suitable openings leading to the UBM laminate 75 that are not visible in FIG. 8 due to the location of the sectioning. However, those openings are visible in FIG. 9, which is a pictorial view of a portion of the mask 135 and the underlying UBM laminate 75 removed from the semiconductor chip 15 depicted in FIG. 8. Note that the mask 135 is lithographically patterned with four arcuate openings 140, 145, 150 and 155. The mask portions 160, 165, 170 and 175 between the arcuate openings 140, 145, 150 and 155 denote the locations of the subsequently formed spokes of the UBM laminate 75 that will be depicted in a subsequent figure. With the mask 135 in place, the UBM laminate 75 is etched. The etch chemistry and process suitable for etching the UBM laminate 75 will depend upon the composition of the laminate 75. In an exemplary embodiment where the UBM laminate 75 is composed of Ti/W, a wet HF etch may be used. Laser etching might be used for material removal. The mask 135 depicted in FIG. 9 may be removed by ashing, solvent stripping or the like from the UBM laminate 75 as shown in FIG. 10. The material removal/etch yields a patterned UBM laminate 75 shown pictorially in FIG. 10. Note that the etch has created the hub 100 and the spokes 105, 110, 115 and 120, although those spokes 105, 110, 115 and 120 are still contiguous with surrounding portion of the UBM laminate 75 at this point. The etch defines the circumferential extent of the spokes 105, 110, 115 and 120 by etching openings 180, 185, 190 and 195 in the UBM laminate 75 that extend down to the underlying passivation structure 55.

Figure 11:
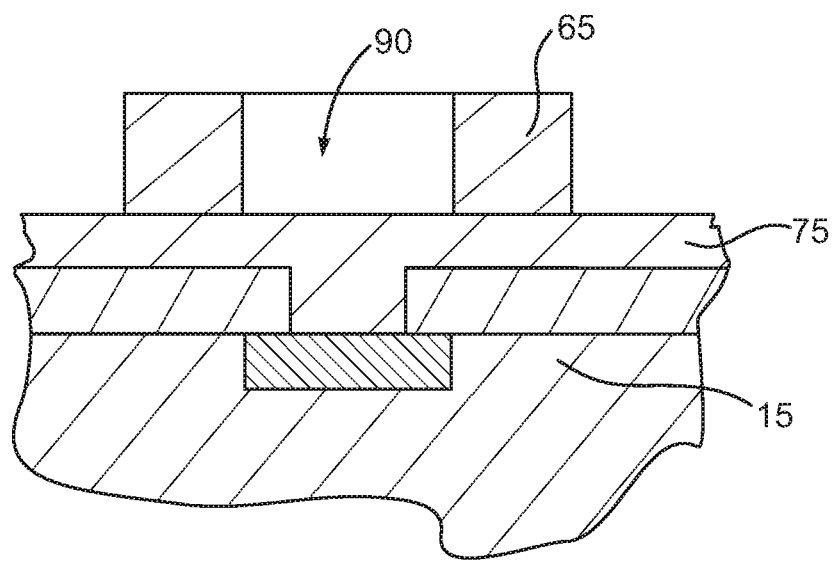
FIG. 11 is a sectional view depicting polymer film application and patterning.

Next and as shown in FIG. 11, the polymer layer 65 is formed on the UBM laminate 75 and patterned with the opening 90 and an island footprint in advance of a subsequent UBM top layer and solder material plating processes. The polymer layer 65 is designed to provide a compliant protective layer and thus may be composed of a variety of materials, such as polyimide, benzocyclobutene or other insulating materials such as silicon nitride or the like and may be deposited by spin coating, CVD or other techniques. If desired, the polymer layer 65 may be composed of polyimide infused with photoactive compounds to enable the photolithographic patterning of the doughnut footprint and the opening 90. The semiconductor chip 15 is subjected to a bake process to cure the polymer layer 65. If the polymer layer 65 is not capable of material removal by way of exposure and developing, then a suitable lithography mask may be applied and an etch performed to yield the requisite openings.

Figure 12:
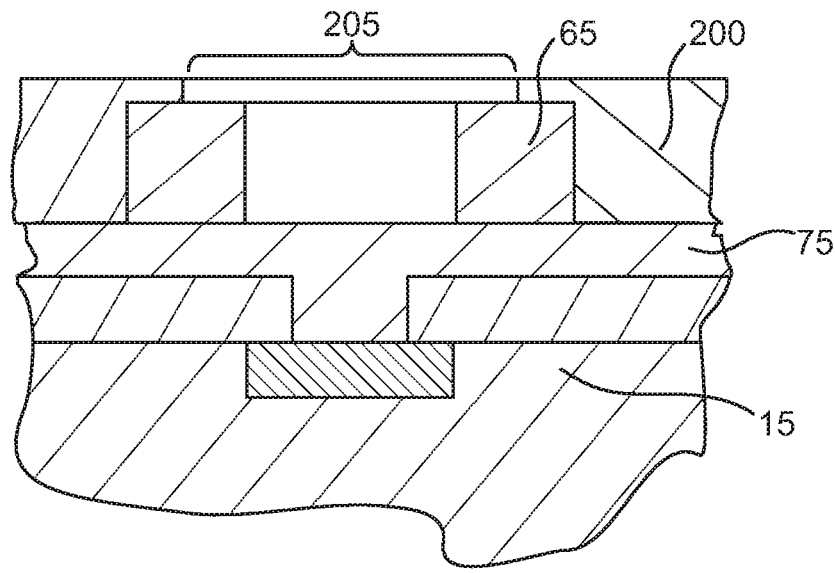
FIG. 12 is a sectional view like FIG. 11, but depicting dry film pattering.

Next and as depicted in FIG. 12, a dry film 200 may be formed on the semiconductor chip 15, and in particular on the polymer layer 65 and the otherwise exposed portions of the UBM laminate 75, and patterned with a suitable opening 205 that will facilitate the subsequent plating of a UBM top layer and a solder structure. The dry film 200 may be composed of negative tone resist or hard mask materials that may be lithographically patterned and etched to establish the opening 205.

Figure 13:
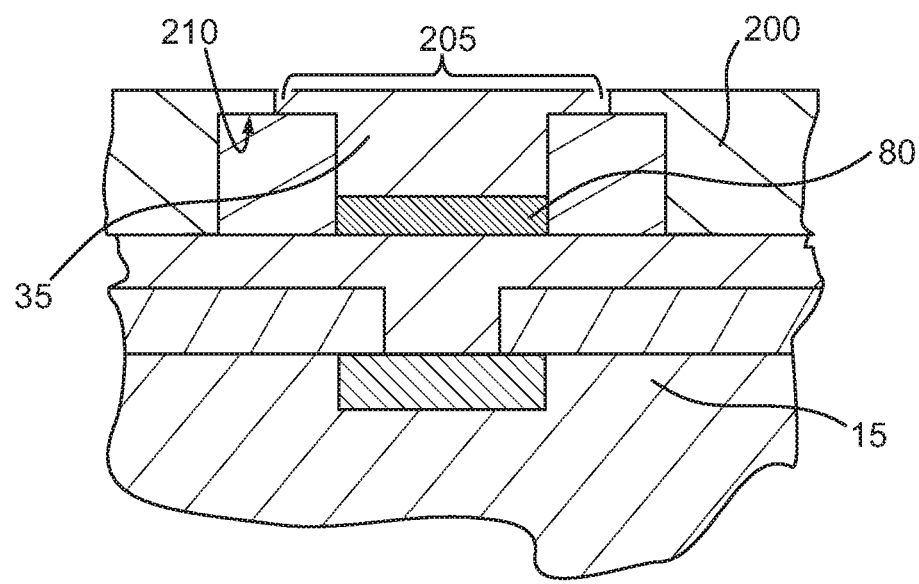
FIG. 13 is a sectional view like FIG. 12, but depicting solder barrier and solder plating.

Next and as depicted in FIG. 13, plating processes may be performed with the dry film 200 in place to apply first the UBM top layer 80, which serves as a solder barrier layer, and then the overlying solder structure 35. The solder structure 35 will through a subsequent reflow process change shape to the solder bump 35 depicted in FIG. 2, which is then used to connect the chip 15 to the circuit board 20. Note that the opening 205 is sized so that a portion of the solder structure 35 plates onto an upper surface 210 of the polymer layer 65 as shown.

Figure 14:
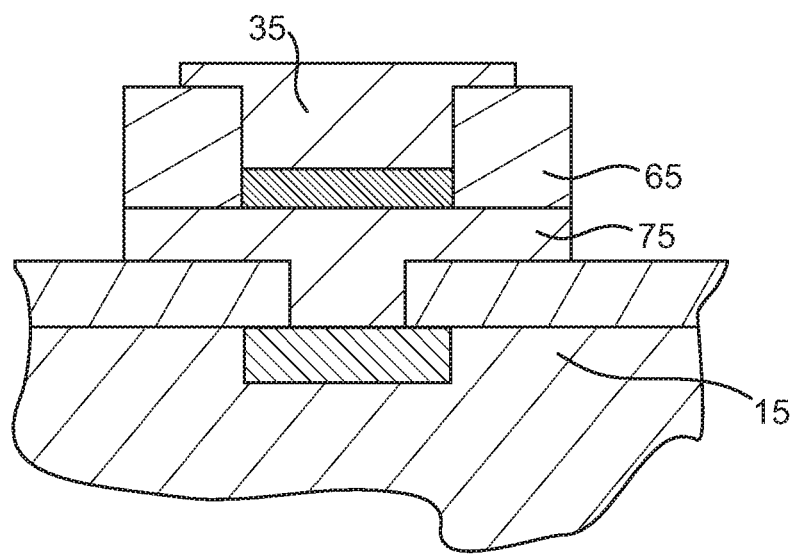
FIG. 14 is a sectional view like FIG. 13, but depicting dry film removal.

The dry film 200 is removed by ashing, solvent stripping or the like to leave the solder structure 35 and the polymer layer 65 exposed as shown in FIG. 14. At this stage, it is necessary to perform a material removal process in order to remove portions of the UBM laminate 75 that are lateral to the location of the solder structure 35. Otherwise, the UBM laminate 75 as shown in FIG. 13 will short to adjacent bump locations such as the bumps 45 and 40 depicted in FIG. 1. The UBM laminate 75 may be etched using the polymer layer 65 as an etch mask using, for example, a hot phosphoric acid dip or other material removal process suitable for removing material from the laminate 75. A hot phosphoric acid dip will typically be isotropic. The semiconductor chip 15 and in particular the solder structure 35 may undergo a reflow process to establish the more rounded solder bump 35 depicted in FIG. 2. Of course the semiconductor chip 15 may be thereafter coupled to the circuit board 20 and subsequent reflow process performed to establish solder joints between the solder bumps 25 and the solder structures 30 depicted in FIG. 1.

Figure 15:
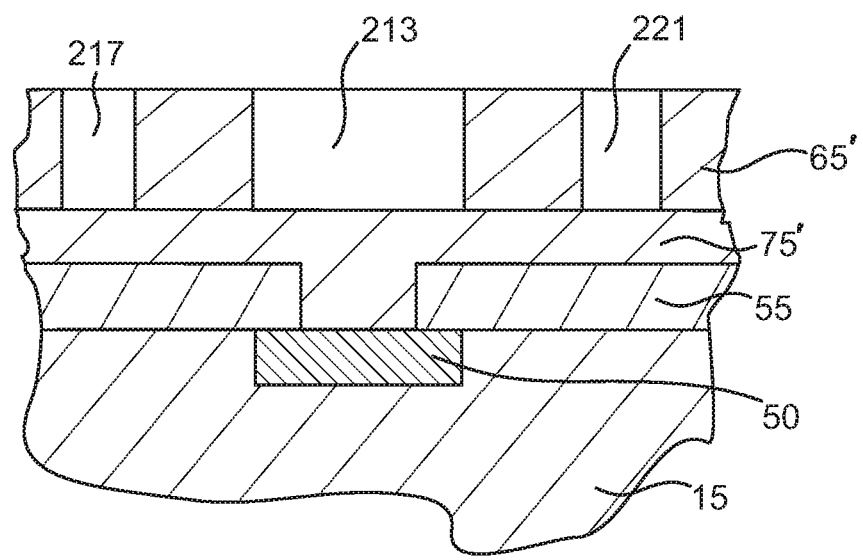
FIG. 15 is a sectional view like FIG. 11, but depicting alternate exemplary polymer film application and patterning.
Figure 16:
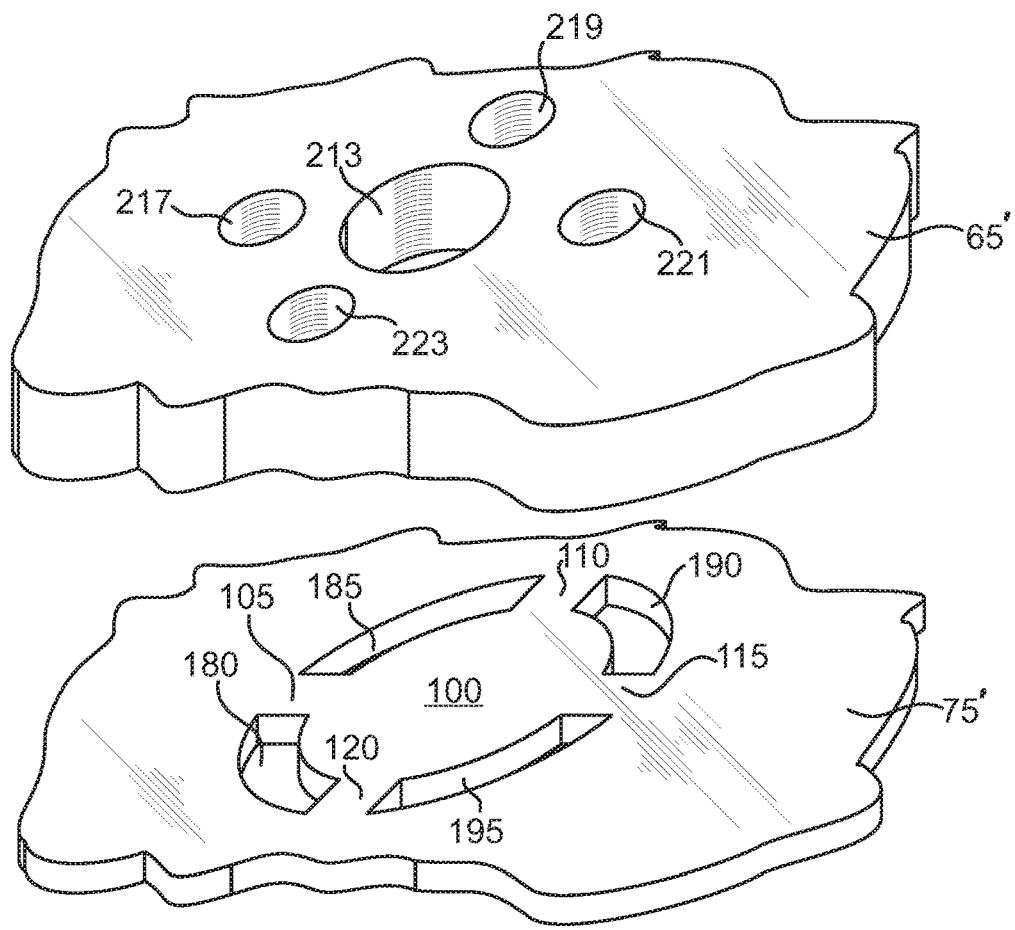
FIG. 16 is a pictorial view depicting exemplary patterning of UBM laminate layers and a polymer layer.

An alternate exemplary process flow for fabricating a UBM may be understood by referring now to FIGS. 15, 16, 17, 18 and 19 and initially to FIG. 15, which is a sectional view like FIG. 11. Here, in lieu of an island-like polymer layer 65 as depicted in FIG. 11, a more expansive polymer film 65' is patterned over a UBM laminate 75'. Other aspects of the semiconductor chip 15 including the passivation structure 55 and the conductor pad 50 may be configured substantially identically to the other embodiments described herein. The UBM laminate 75' may be manufactured up to this point using the techniques described above in conjunction with the UBM laminate 75. Referring now also to FIG. 16, which is a pictorial view of a portion of the UBM laminate 75' and the polymer layer 65' exploded therefrom, the UBM laminate 75' may be patterned with the same general pattern as the UBM laminate 75 as shown in FIG. 10. Thus, there may be a hub 100, spokes 105, 110, 115 and 120 separated by circumferentially by openings 180, 185, 190 and 195. However the polymer layer 65' is patterned with more than a single opening to the UBM laminate 75'. Here, the polymer layer 65' may be patterned with an opening 213 leading to the hub 100 and one or more secondary openings 217, 219, 221 and 223 that are approximately aligned vertically with the spokes 105, 110, 115 and 120. The opening 213 will eventually serve as an aperture for establishing a top UBM layer and for plating a portion of the subsequently formed solder bump. The secondary openings 217, 219, 221 and 223 will serve as apertures for material removal by etch or otherwise so that some or all of the spokes 105, 110, 115 and 120 are removed/severed in order to electrically isolate the hub 100 from the surrounding more extensive portions of the UBM laminate 75'. The various openings 213, 217, 219, 221 and 223 may be established in a polymer layer 65' using the techniques described above in conjunction with the fabrication of the polymer layer 65.

Figure 17:
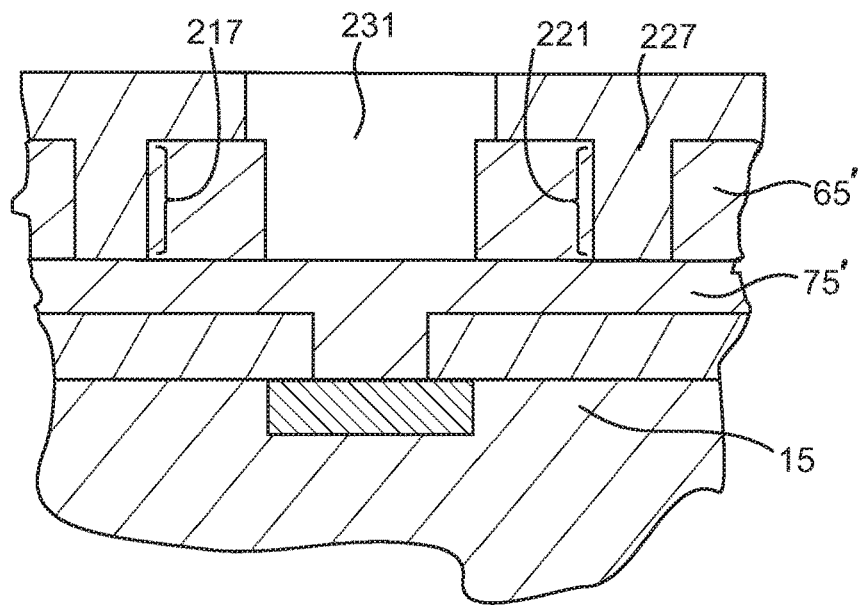
FIG. 17 is a sectional view like FIG. 15, but depicting dry film pattering.

Referring now to FIG. 17, a dry film 227 may be fabricated over the polymer layer 65'. The objective is to provide a mask to cover all but an opening 231 that is aligned with the opening 213 in the polymer layer 65' so that a plating process may be performed to establish a top UBM layer (not shown) in ohmic contact with the UBM laminate 75'. The openings 217 and 221 and the additional secondary openings 219 and 223 that are not shown in FIG. 17 are filled and thus masked by the dry film 227.

Figure 18:
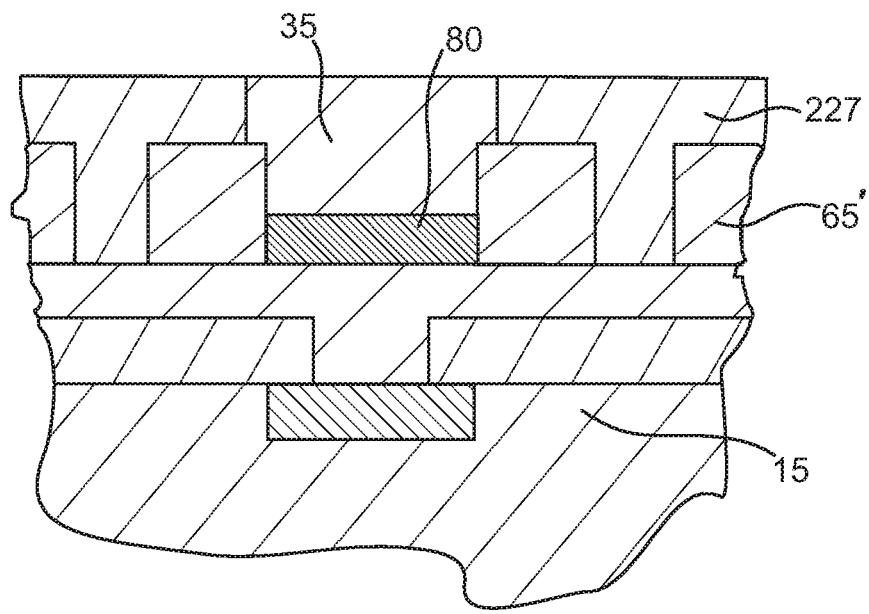
FIG. 18 is a sectional view like FIG. 17, but depicting solder barrier and solder plating.
Figure 19:
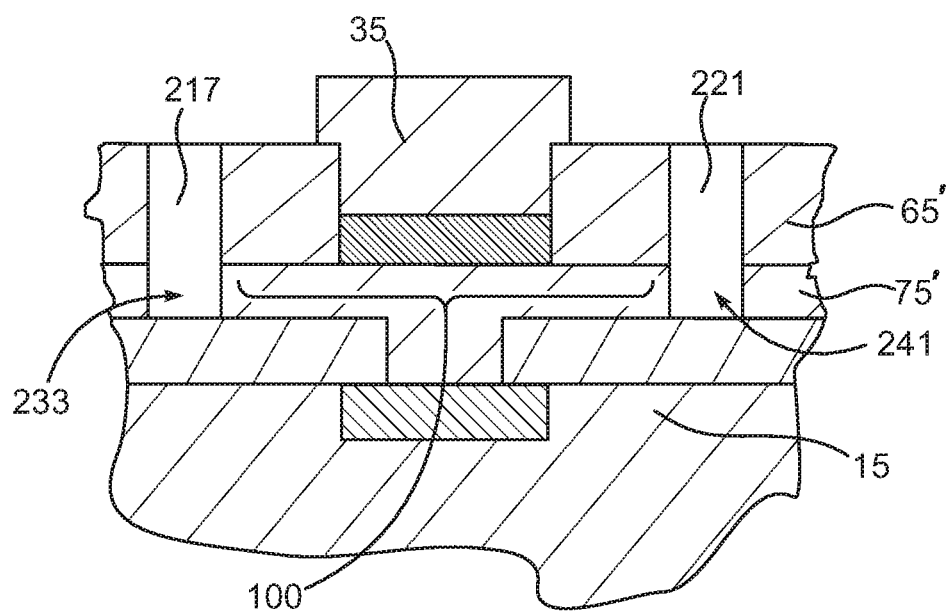
FIG. 19 is a sectional view like FIG. 18, but depicting dry film removal.
Figure 20:
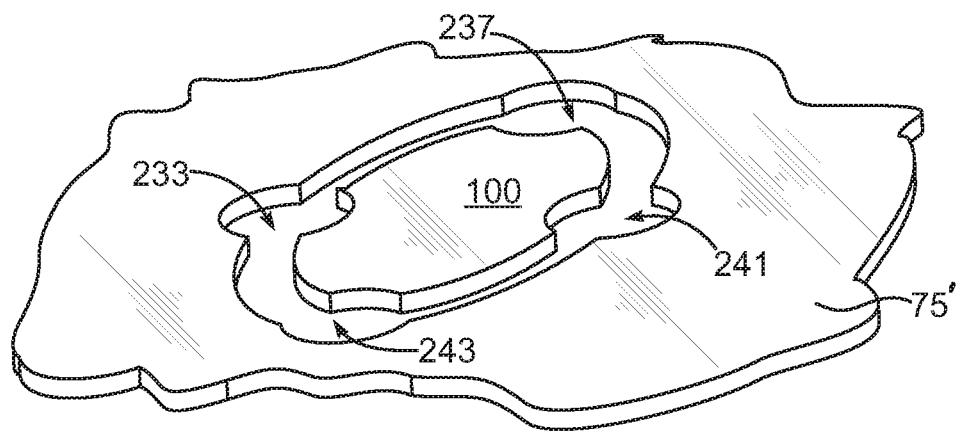
FIG. 20 is a pictorial view depicting exemplary material removal from the UBM laminate layers.

Following application of the dry film 227 and as shown in FIG. 18, a plating process may be performed on the semiconductor chip 15 to establish the UBM top layer 80 on the UBM laminate 75' and the solder structure 35 partially in the polymer layer 65' as described elsewhere herein. Next and as shown in FIG. 19, the dry film 227 is stripped using the techniques described above in conjunction with the other dry film 200 shown in FIG. 12 to leave the polymer layer 65', the visible secondary openings 217 and 221 and the latent secondary openings 219 and 223 in the polymer layer 65' exposed as well as a portion of the solder structure 35. At this point, a material removal process, such as a chemical or laser etch, is performed using the polymer layer 65' as an etch mask to sever the electrical connections between the UBM laminate hub 100 and the surrounding portions of the UBM laminate 75'. Etching techniques as described elsewhere herein may be used. The result of this etch is also depicted in FIG. 20, which is a pictorial view like FIG. 10 but of the alternative exemplary UBM laminate 75' post etch. Note that areas 233, 237, 241 and 243 have been removed to sever the electrical connections between the hub 100 and the surrounding portion of the UBM laminate 75'. It should be understood that the openings 217, 219, 221 and 223 may be other than circular and thus the areas 233, 237, 241 and 243 may have other than a circular footprint depending on, of course, the footprint of the openings 217, 219, 221 and 223. Referring again to FIG. 19, a bump reflow process may follow the dry film strip to establish the solder bump 35'.

Figure 21:
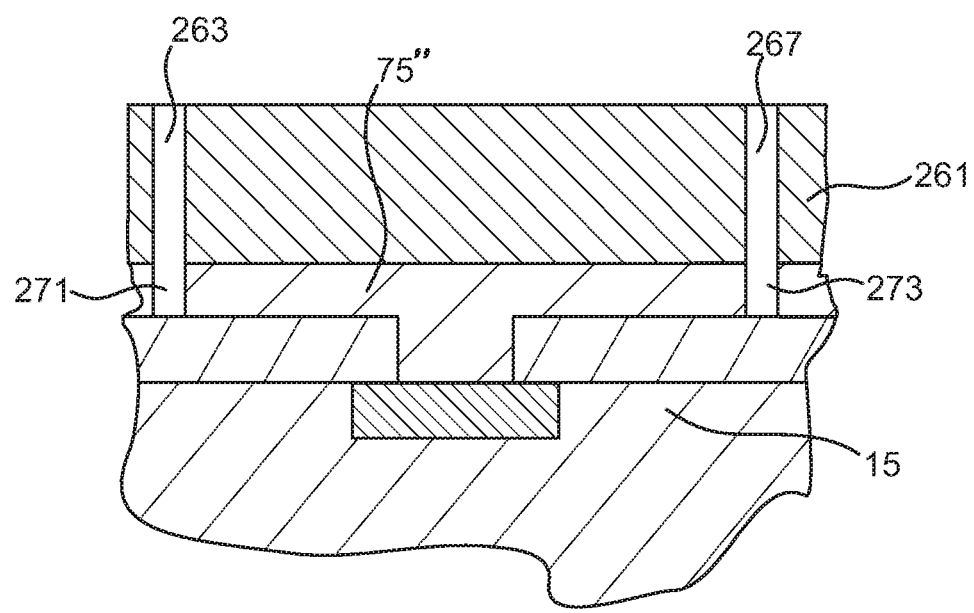
FIG. 21 is a sectional view like FIG. 8, but depicting alternate masking of and material removal from a UBM laminate.

The adhesion between a polymer film and an underlying UBM laminate may be improved as desired by fabricating the UBM laminate with additional degaussing holes. For example, and as shown in FIG. 21, which is a sectional view like FIG. 8 but showing an alternative structure UBM laminate 75", a UBM laminate etch mask 261 may be patterned with openings 263 and 267 exposing portions of the UBM laminate 75" and then an etch performed that etches openings 271 and 273 in the UBM laminate 75" that will eventually be filled with portions of the overlying polymer film to improve adhesion. Again, chemical or laser etching may be used for material removal. This material removal step may be performed in conjunction with the prior to or with the step depicted in FIG. 19.

Figure 22:
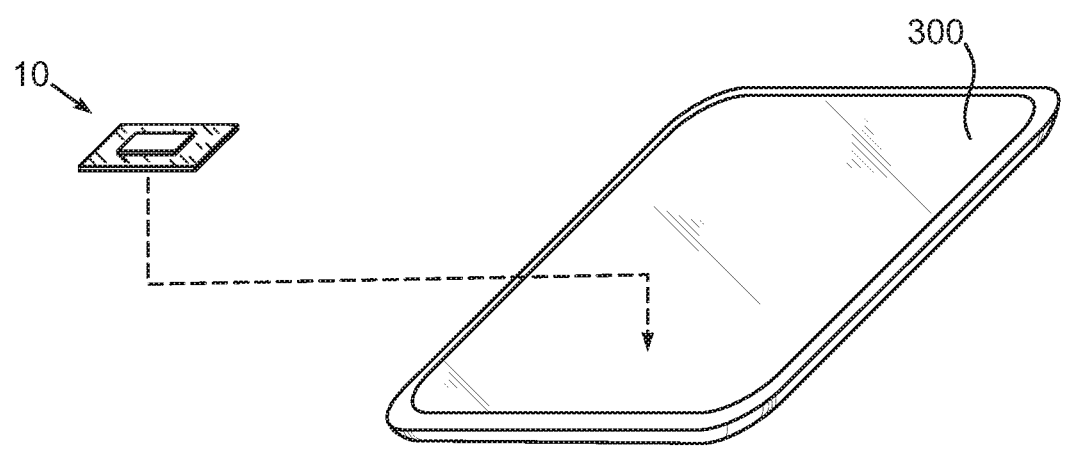
FIG. 22 is a pictorial view of an exemplary semiconductor chip device exploded from an electronic device.

Any of the disclosed embodiments of the semiconductor chip devices 10 may be mounted on another electronic device. In this regard, attention is now turned to FIG. 22, which depicts the semiconductor chip device 10 exploded from an electronic device 300. The electronic device 300 may be a computer, a server, a hand held device, or virtually any other electronic component.

The solder interconnect structures disclosed herein are not dependent on particular functionalities of either the semiconductor chip 15 or the circuit board 20. Thus, the semiconductor chip 15 may be any of a myriad of different types of circuit devices used in electronics, such as, for example, microprocessors, graphics processors, combined microprocessor/graphics processors, application specific integrated circuits, memory devices or virtually any other device or the like, and may be single or multi-core or even stacked with additional dice. The semiconductor chip 15 may be constructed of bulk semiconductor, such as silicon or germanium, or semiconductor on insulator materials, such as silicon-on-insulator materials. The semiconductor chip 15 may be flip-chip mounted to the circuit board 20 and electrically connected thereto by solder joints or other structures (not visible in FIG. 1 but shown in subsequent figures).

The circuit board 20 may be a semiconductor chip package substrate, a circuit card, or virtually any other type of printed circuit board. Although a monolithic structure could be used for the circuit board 20, a more typical configuration will utilize a build-up design. In this regard, the circuit board 20 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures in order to provide power, ground and signals transfers between the semiconductor chip 15 and another circuit device that is not shown. To facilitate those transfers, the circuit board 20 may be provided with input/outputs in the form of a pin grid array, a ball grid array, a land grid array or other type of interconnect scheme.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
a semiconductor chip having a conductor pad;
a first underbump metallization layer on a semiconductor chip, the first underbump metallization layer having a hub, the hub positioned vertically and horizontally over the conductor pad, a first portion extending laterally from the hub, and a spoke connecting the hub to the first portion; and
a polymer layer on the first underbump metallization layer, the polymer layer including a first opening in alignment with the hub and the conductor pad and a second opening in alignment with the spoke.

2. The apparatus of claim 1, comprising a circuit board coupled to the semiconductor chip.

3. The apparatus of claim 2, wherein the circuit board comprises a semiconductor chip package substrate.

4. The apparatus of claim 1, comprising a second underbump metallization layer on the first underbump metallization layer and a solder structure on the second underbump metallization layer and in the first opening.

5. The apparatus of claim 1, wherein the first underbump metallization layer comprises plural openings and the polymer layer comprises plural portions positioned in respective of the plural openings.

6. The apparatus of claim 1, wherein the first underbump metallization layer comprises plural spokes connecting the hub to the first portion and the polymer layer comprises plural second openings each of which is in alignment with one of the spokes.

7. The apparatus of claim 1, comprising an electronic device, the apparatus being mounted in the electronic device.

8. An apparatus, comprising:
a semiconductor chip having a conductor pad;
a first underbump metallization layer on a semiconductor chip, the first underbump metallization layer having a hub, the hub positioned vertically and horizontally over the conductor pad, a first portion extending laterally from the hub; and a spoke connecting the hub to the first portion, and a polymer layer on the first underbump metallization layer, the polymer layer including a first opening in alignment with the hub and the conductor pad.

9. The apparatus of claim 8, wherein the first underbump metallization layer comprises plural openings and the polymer layer comprises plural portions positioned in respective of the plural openings.

10. The apparatus of claim 8, wherein the hub is round.

11. The apparatus of claim 8, comprising a circuit board coupled to the semiconductor chip.

12. The apparatus of claim 11, wherein the circuit board comprises a semiconductor chip package substrate.

13. The apparatus of claim 11, comprising an electronic device, the apparatus being mounted in the electronic device.

14. The apparatus of claim 8, comprising a second underbump metallization layer on the first underbump metallization layer and a solder structure on the second underbump metallization layer and in the first opening.

15. An apparatus, comprising:
a semiconductor chip package substrate;
a semiconductor chip mounted on the semiconductor chip package substrate, the semiconductor chip having a conductor pad, a first underbump metallization layer, the first underbump metallization layer having a hub, the hub positioned vertically and horizontally over the conductor pad, a first portion extending laterally from the hub and a spoke connecting the hub to the first portion; and
a polymer layer on the first underbump metallization layer, the polymer layer including a first opening in alignment with the hub and the conductor pad.

16. The apparatus of claim 15, wherein the first underbump metallization layer comprises plural openings and the polymer layer comprises plural portions positioned in respective of the plural openings.

17. The apparatus of claim 15, wherein the hub is round.

18. The apparatus of claim 11, comprising an electronic device, the apparatus being mounted in the electronic device.

19. The apparatus of claim 15, comprising a second underbump metallization layer on the first underbump metallization layer and a solder structure on the second underbump metallization layer and in the first opening.

20. The apparatus of claim 19, wherein the solder structure electrically couples the semiconductor chip to the package substrate.

* * * * *